(12) United States Patent
Liao et al.

(10) Patent No.: US 11,852,470 B2
(45) Date of Patent: Dec. 26, 2023

(54) INSPECTING DEVICE

(71) Applicants: Global Unichip Corporation, Hsinchu (TW); Taiwan Semiconductor Manufacturing Company, Ltd., Hsinchu (TW)

(72) Inventors: Chih-Chieh Liao, Hsinchu (TW); Yu-Min Sun, Hsinchu (TW); Chih-Feng Cheng, Hsinchu (TW)

(73) Assignees: Global Unichip Corporation, Hsinchu (TW); Taiwan Semiconductor Manufacturing Company, Ltd., Hsinchu (TW)

(*) Notice: Subject to any disclaimer, the term of this patent is extended or adjusted under 35 U.S.C. 154(b) by 610 days.

(21) Appl. No.: 17/120,253

(22) Filed: Dec. 13, 2020

(65) Prior Publication Data

US 2022/0136816 A1    May 5, 2022

(30) Foreign Application Priority Data

Oct. 29, 2020 (TW) ................................. 109137550

(51) Int. Cl.
  *G01B 5/20* (2006.01)
  *G01N 21/88* (2006.01)
  *G01R 31/00* (2006.01)

(52) U.S. Cl.
  CPC ............. *G01B 5/204* (2013.01); *G01N 21/88* (2013.01); *G01R 31/00* (2013.01)

(58) Field of Classification Search
  CPC ........ G01B 5/204; G01N 21/88; G01R 31/00; G01R 31/2879; G01R 31/2896; G01R 31/2863

(Continued)

(56) References Cited

U.S. PATENT DOCUMENTS 7,372,286 B2* 5/2008 Lee .................... G01R 1/07378
                                          324/754.18

FOREIGN PATENT DOCUMENTS

CN    1662820     8/2005
CN    107004656   8/2017

(Continued)

OTHER PUBLICATIONS

Office Action of Taiwan Counterpart Application, dated Apr. 27, 2021, pp. 1-3.

*Primary Examiner* — Farhana A Hoque
(74) *Attorney, Agent, or Firm* — JCIPRNET

(57) ABSTRACT

An inspecting device including a carrier, multiple telescopic probes, a locking component and a conductive structure is provided. The carrier has a through hole and a ground pad corresponding to the through hole. The through hole penetrates from the first surface to the second surface of the carrier, and the ground pad is disposed on the second surface. The telescopic probes are disposed in parallel on the first surface of the carrier. The locking component passes through the through hole and is disposed between two adjacent telescopic probes of the multiple telescopic probes. The locking component includes a screw. A head of the screw has a first pitch and a second pitch, and a density of the first pitch is different from a density of the second pitch. The conductive structure is partially embedded in the locking component, and the conductive structure, the locking component and the ground pad are electrically connected.

20 Claims, 5 Drawing Sheets

(58) Field of Classification Search
USPC .................................................. 324/754.01
See application file for complete search history.

(56) References Cited

FOREIGN PATENT DOCUMENTS

| | | |
|---|---|---|
| TW | 200925619 | 6/2009 |
| TW | 202029452 | 8/2020 |
| WO | 03087854 | 10/2003 |

* cited by examiner

INSPECTING DEVICE

CROSS-REFERENCE TO RELATED APPLICATION

This application claims the priority benefit of Taiwan application serial no. 109137550, filed on Oct. 29, 2020. The entirety of the above-mentioned patent application is hereby incorporated by reference herein and made a part of this specification.

BACKGROUND

Technical Field

The disclosure relates to an inspecting device, and more particularly to an inspecting device capable of improving the backflow path of the power supply.

Description of Related Art

Generally, after a semiconductor package is manufactured, a final test (FT) is performed on the semiconductor package to ensure the quality of the semiconductor package when it is shipped. In electrical inspecting, since the telescopic probes of the inspecting device produce a reaction force when they are pressed, too many telescopic probes cause the warpage of the carrier. Currently, screws are disposed on the carrier to reduce the warpage.

However, because the screws take part of the space of the telescopic probes, and the semiconductor package is floatingly disposed on the screws and is not electrically connected to the screws, the backflow path of currents is reduced, the ratio of current backflow is decreased, and the current that has not flowed back is discharged through other places, which adversely affects the inspecting device.

SUMMARY

The disclosure provides an inspecting device capable of improving the backflow path of currents while reducing the warpage, increasing the ratio of current backflow, and thereby having a better power integrity/signal integrity performance.

An inspecting device in the disclosure includes a carrier, multiple telescopic probes, a locking component, and a conductive structure. The carrier has a through hole and a ground pad corresponding to the through hole. The carrier has a first surface and a second surface opposite to the first surface, the through hole penetrates from the first surface to the second surface, and the ground pad is disposed on the second surface. The telescopic probes are disposed in parallel on the first surface of the carrier. The locking component passes through the through hole and is disposed between two adjacent telescopic probes of the multiple telescopic probes. The locking component includes a screw. The head of the screw has a first pitch and a second pitch, and the density of the first pitch is different from the density of the second pitch. The conductive structure is partially embedded in the locking component, and the conductive structure, the locking component, and the ground pad are electrically connected.

An inspection device in the disclosure is adapted for inspecting semiconductor packages. An inspecting device includes a carrier, multiple telescopic probes, a locking component, and a conductive structure. The carrier has a through hole and a ground pad corresponding to the through hole. The carrier has a first surface and a second surface opposite to the first surface, the through hole penetrates from the first surface to the second surface, and the ground pad is disposed on the second surface. The telescopic probes are disposed in parallel on the first surface of the carrier. The locking component passes through the through hole and is disposed between two adjacent telescopic probes of the multiple telescopic probes. The locking component includes a screw. The head of the screw has a first pitch and a second pitch, and the density of the first pitch is different from the density of the second pitch. A conductive structure is disposed on the locking component. The inspecting device is adapted for currents of the semiconductor packages to flow back to the ground pad through the conductive structure and the locking component.

Based on the above, a conductive structure is designed in the inspecting device in the disclosure, the conductive structure is partially embedded in the locking component, and the conductive structure, the locking component, and the ground pad are electrically connected, so that the current of the semiconductor package flows back to the ground pad through the conductive structure and the locking component during subsequent inspections. Therefore, the backflow path of currents is improved while the warpage is reduced, and the ratio of current backflow is increased, and thereby having a better power integrity/signal integrity performance. In addition, the locking component may include screws with different pitch densities, so that during electrical inspection the probability of the shaking of the inspecting device which affects the inspection result is reduced.

In order to make the aforementioned features and advantages of the disclosure comprehensible, embodiments accompanied with drawings are described in detail below.

DESCRIPTION OF THE EMBODIMENTS

Figure 1A:
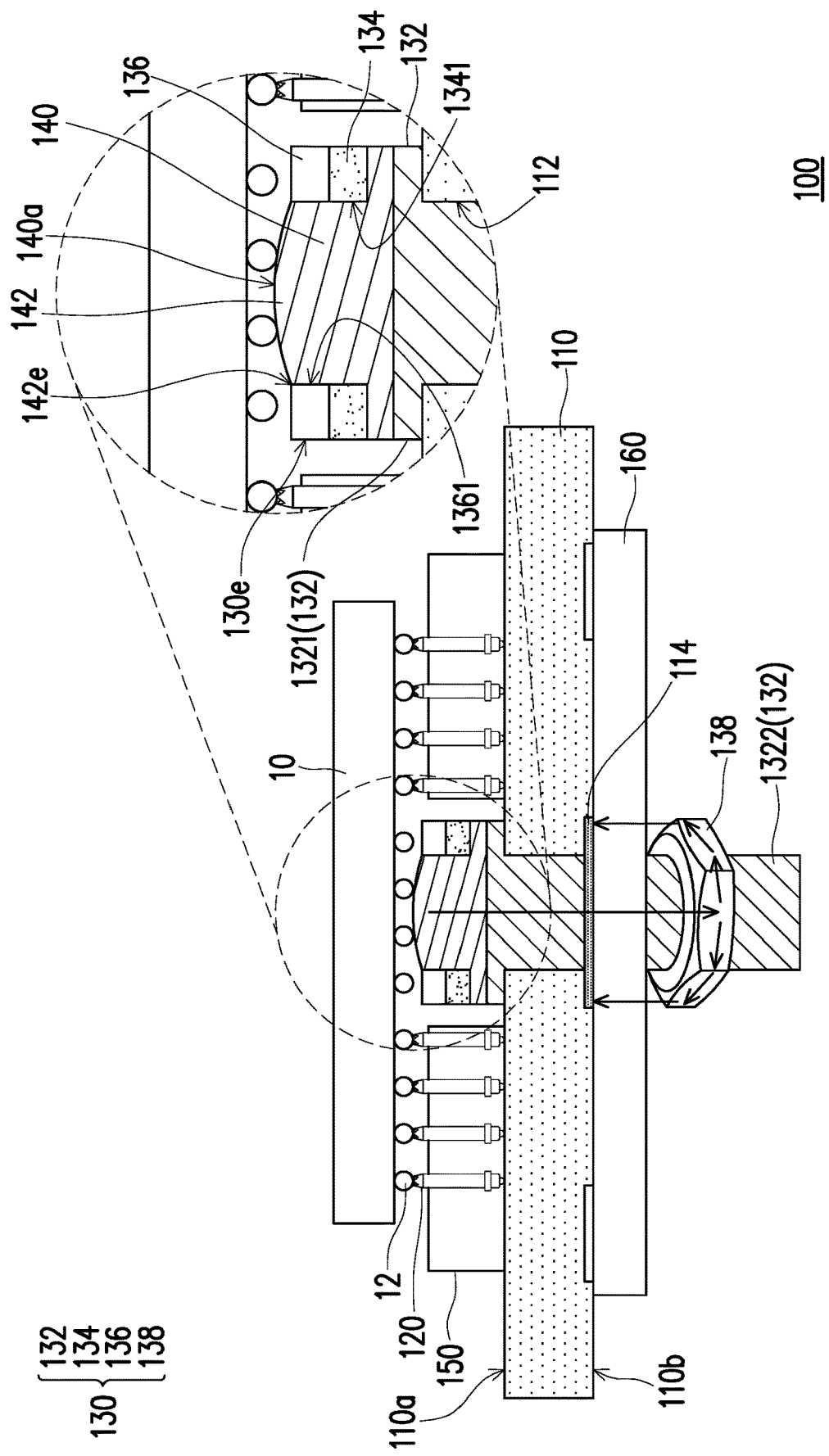
FIG. 1A is a partial cross-sectional schematic view of an inspecting device according to an embodiment of the disclosure.

Directional terminology mentioned in the specification, such as "top", "bottom", "front", "back", "left", "right", etc., is used with reference to the orientation of the drawings being described. Therefore, the used directional terminology is only intended to illustrate, rather than limit, the disclosure.

The disclosure will be explained more fully with reference to the drawings of the embodiments. However, the disclosure can also be implemented in various different forms and should not be limited to the embodiments described herein. For clarity, a relative size, a thickness, and a location of each film layer or region may be enlarged. The same or similar reference numerals refer to the same or similar elements and are not iterated in the following.

Figure 1B:
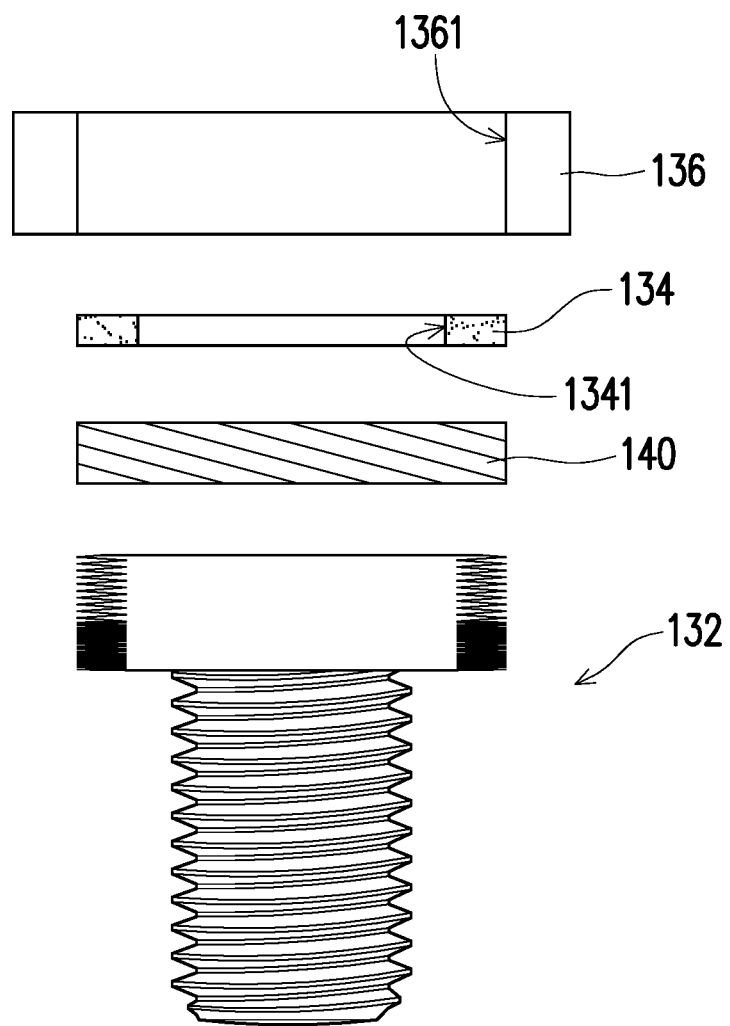
FIG. 1B is a schematic view illustrating an assembly of a locking component and a conductive structure of an inspecting device according to an embodiment of the disclosure.
Figure 1C:
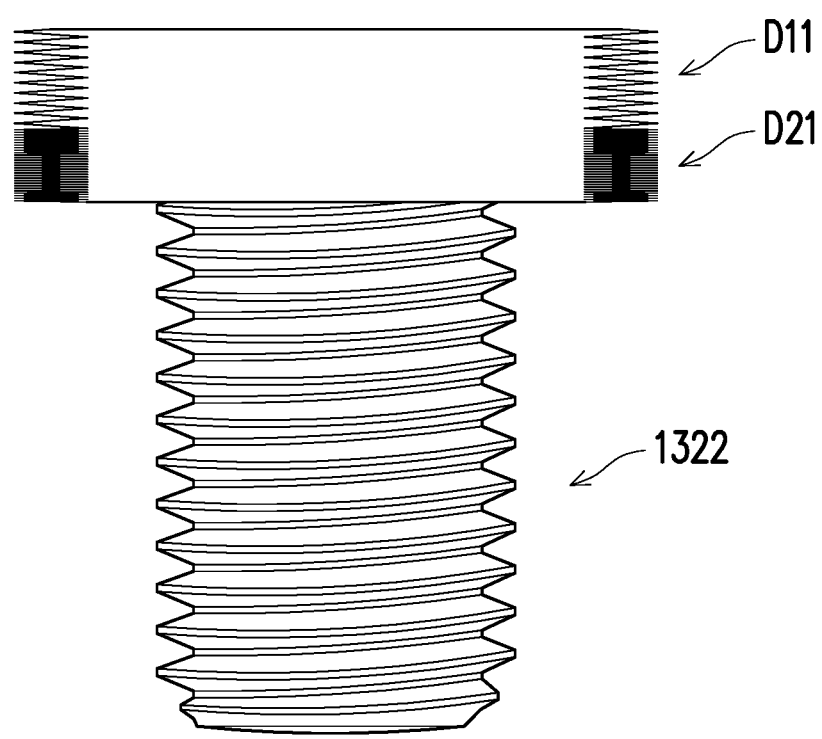
FIG. 1C is a perspective schematic view of a screw of a locking component of an inspecting device according to an embodiment of the disclosure.
Figure 1D:
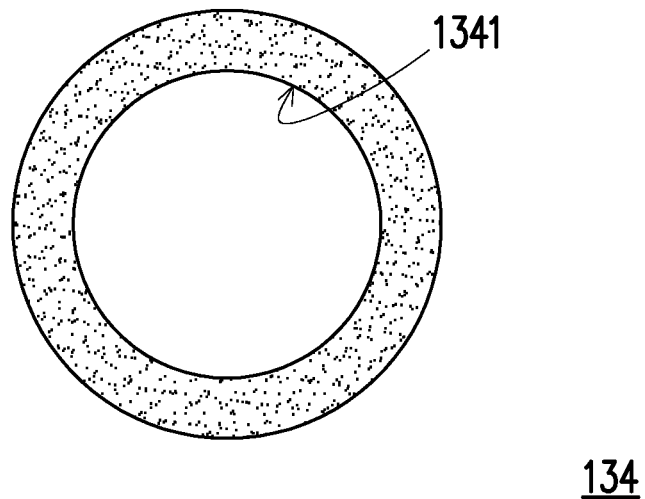
FIG. 1D is a schematic top view of a gasket of a locking component of an inspecting device according to an embodiment of the disclosure.
Figure 1E:
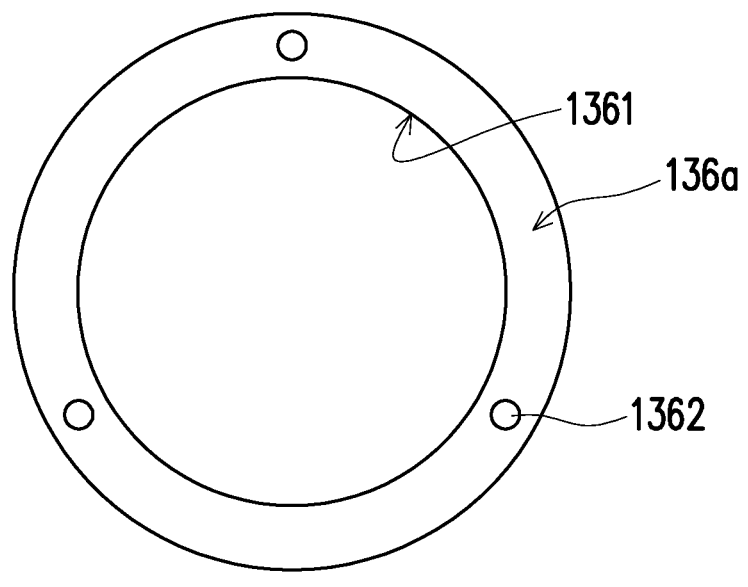
FIG. 1E is a schematic top view of a threaded sleeve of a locking component of an inspecting device according to an embodiment of the disclosure.

FIG. 1A is a partial cross-sectional schematic view of an inspecting device according to an embodiment of the disclosure. FIG. 1B is a schematic view illustrating an assembly of a locking component and a conductive structure of an inspecting device according to an embodiment of the disclosure. FIG. 1C is a perspective schematic view of a screw of a locking component of an inspecting device according to an embodiment of the disclosure. FIG. 1D is a schematic top view of a gasket of a locking component of an inspecting device according to an embodiment of the disclosure. FIG. 1E is a schematic top view of a threaded sleeve of a locking component of an inspecting device according to an embodiment of the disclosure.

Refer to FIG. 1A to FIG. 1E. In the disclosure, an inspecting device 100 is adapted for inspecting an object to be inspected, and the object to be inspected is, for example, a semiconductor package 10. The inspecting device 100 includes a carrier 110, multiple telescopic probes 120, a locking component 130, and a conductive structure 140. Furthermore, the carrier 110 may have a through hole 112 and a ground pad 114 corresponding to the through hole 112, and the carrier 110 has a first surface 110a and a second surface 110b opposite to the first surface 110a. The through hole 112 penetrates from the first surface 110a to the second surface 110b, and the ground pad 114 is disposed on the second surface 110b. Moreover, the through hole 112 may be adapted to accommodate the locking component 130. Meanwhile, the carrier 110 may be any suitable circuit substrate, and the disclosure is not limited thereto.

In the embodiment, multiple telescopic probes 120 are disposed in parallel on the first surface 110a of the carrier 110, one end of each telescopic probe 120 is connected to a contact (not shown) on the carrier 110, and another end abuts the conductive terminal 12 of the semiconductor package 10 for signal inspection of the semiconductor package 10. Meanwhile, the conductive terminal 12 is a solder ball, but the disclosure is not limited thereto, and the type of the conductive terminal 12 is determined according to actual design requirements.

In an embodiment, the inspecting device 100 further includes a probe holder 150, and the telescopic probes 120 are located side by side inside the probe holder 150 and pass through the probe holder 150 in parallel with one another. For example, the probe holder 150 may have an internal space and multiple cylindrical grooves (not shown). The cylindrical grooves may be parallel to one another and connected to the internal space, so that the telescopic probes 120 respectively are fixed to the cylindrical grooves.

In addition, the locking component 130 passes through the through hole 112 and is disposed between two adjacent telescopic probes 120 of the multiple telescopic probes 120. Specifically, the locking component 130 may include a screw 132. The screw 132 includes a head 1321 and an end 1322 connected to the head 1321. For example, the head 1321 is a part of the screw 132 protruding from the first surface 110a of the carrier 110, and the end 1322 is a part of the screw 132 passing through the through hole 112, but the disclosure is not limited thereto.

The conductive structure 140 is designed in the inspecting device 100 in the embodiment, the conductive structure 140 is partially embedded in the locking component 130, and the conductive structure 140, the locking component 130 and the ground pad 114 are electrically connected, so that the current of the semiconductor package 10 flows back to the ground pad 114 through the conductive structure 140 and the locking component 130 during subsequent inspections. The flowing direction of the current is shown as the arrow in FIG. 1A. Therefore, the backflow path of currents is improved while the warpage is reduced, and the ratio of the current backflow is increased, and thereby having a better power integrity/signal integrity performance.

On the other hand, the locking component 130 is designed in the inspecting device 100, so that the head 1321 of the screw 132 has a pitch D11 and a pitch D21, and the density of the pitch D11 is different from the density of the pitch D21. Therefore, the screw 132 with different pitch densities is included in the locking component 130 so that during electrical inspection the probability of the shaking of the inspecting device 100 which affects the inspection result is reduced.

In an embodiment, the increased ratio of the current backflow of the inspecting device 100 is, for example, 70%, but the disclosure is not limited thereto.

In an embodiment, the density of the pitch D11 is less than the density of the pitch D21, and the pitch D11 is farther away from the carrier 110 than the pitch D21. In other words, the pitch D11 has a relatively sparse thread, the pitch D21 has a denser thread, and the pitch D21 connects the pitch D11 and the end 1322. However, the disclosure is not limited thereto. In other embodiments, the screw may have other types of pitch design.

In an embodiment, the conductive structure 140 may include conductive glue so that the longitudinal conductivity characteristics of the conductive glue is adapted for electrical connection, but the disclosure is not limited thereto. The conductive structure 140 may be made from any suitable conductive material.

In some embodiments, the top surface 140a of the conductive structure 140 may be coplanar with the top surfaces of the multiple telescopic probes 120, so that the conductive terminals 12 of the semiconductor package 10 substantially abut the conductive structure 140 during subsequent inspections, reducing the ratio of the floatingly disposition of the conductive terminals 12, and making effective electrical connections. However, the disclosure is not limited thereto.

In an embodiment, the conductive structure 140 may have a protruding portion 142 on the locking component 130, the edge 142e of the protruding portion 142 and the edge 130e of the locking component 130 may have a distance, but the disclosure is not limited thereto.

In an embodiment, the protruding portion 142 may be arched. In other words, the top surface 140a of the conductive structure 140 may be arched, but the disclosure is not limited thereto.

In an embodiment, the locking component 130 may further include a gasket 134 and a threaded sleeve 136 stacked on the head 1321, and a part of the conductive structure 140 is located between the gasket 134 and the head 1321. Furthermore, as shown in FIG. 1A, FIG. 1B, FIG. 1D, and FIG. 1E, the gasket 134 and the threaded sleeve 136 respectively have a first hollow portion 1341 and a second hollow portion 1361, and the conductive structure 140 is extruded from the first hollow portion 1341 and the second hollow portion 1361, but the disclosure is not limited thereto.

In an embodiment, the gasket 134 may be located between the threaded sleeve 136 and a part of the conductive structure 140 to reduce friction between the threaded sleeve 136 and the conductive structure 140 when the threaded sleeve 136 and the screw 132 are locked together, thereby damaging the conductive structure 140, but the disclosure is not limited thereto.

In an embodiment, the top 136a of the threaded sleeve 136 may have a removal hole 1362 so that the threaded sleeve 136 is separated from the screw 132 by a corresponding jig (not shown) during subsequent maintenance or replacement. However, the disclosure is not limited thereto.

In the embodiment, the locking component 130 further includes a nut 138. The nut 138 passes through the end 1322 of the screw 132 and is disposed on the second surface 110b. Furthermore, the inspecting device 100 is adapted for the current of the semiconductor package 10 to flow back to the ground pad 114 through the conductive structure 140, the screw 132, and the nut 138, and the flowing direction of the current is shown as the arrow in FIG. 1A. Therefore, when the inspecting device further includes the nut 138, the backflow path of currents is improved while the warpage is reduced, and the ratio of the current backflow is increased, and thereby having a better power integrity/signal integrity performance. However, the disclosure is not limited thereto.

In the embodiment, the inspecting device 100 further includes a supporting plate 160. The supporting plate 160 is disposed on the second surface 110b. The screw 132 passes through and is disposed on the supporting plate 160, and the supporting plate 160 includes a conductive material. Meanwhile, the conductive material may be any suitable material, and the disclosure is not limited thereto. Furthermore, the inspecting device 100 is adapted for the current of the semiconductor package 10 to flow back to the ground pad 114 through the conductive structure 140, the screw 132, the nut 138, and the supporting plate 160, and the flowing direction of the current is shown as the arrow in FIG. 1A. Therefore, when the inspecting device 100 further includes the supporting plate 160, the backflow path of currents is improved while the warpage is reduced, and the ratio of the current backflow is increased, and thereby having a better power integrity/signal integrity performance. However, the disclosure is not limited thereto.

In an embodiment, when the semiconductor package 10 is a large-sized package (e.g., the size is greater than or equals to 60 mm×60 mm), the warpage of the inspecting device is more obvious, and therefore better results are attained when the inspecting device 100 is adapted for inspecting the large-sized semiconductor package 10, but the disclosure is not limited thereto.

In an embodiment, the orthographic projection of the conductive structure 140 on the carrier 110 overlaps the ground pad 114, but the disclosure is not limited thereto.

In an embodiment, the orthographic projection of the locking component 130 on the carrier 110 overlaps the ground pad 114, but the disclosure is not limited thereto.

In an embodiment, the conductive structure 140 may be in direct contact with the screw 132, but the disclosure is not limited thereto.

Note that same or similar reference numerals and part of the description cited in the following embodiments are the same as elements in the foregoing embodiments, and explanation of the same technical content is omitted. For the explanation, refer to the foregoing embodiments and it will not be iterated in the following embodiments.

Figure 2:
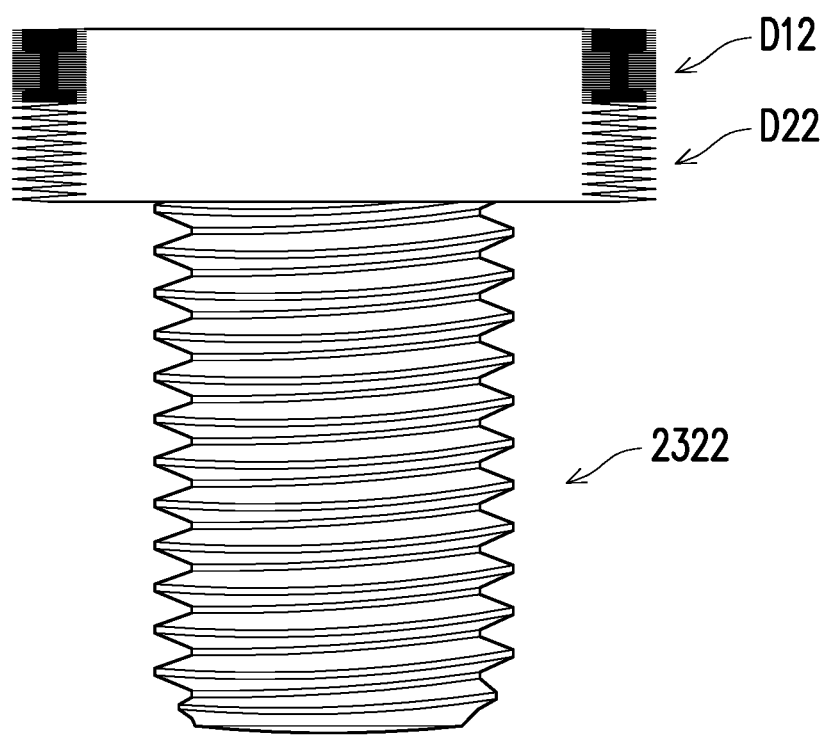
FIG. 2 is a perspective view of a screw of a locking component of an inspecting device according to another embodiment of the disclosure.

FIG. 2 is a perspective view of a screw of a locking component of an inspecting device according to another embodiment of the disclosure. Refer to FIG. 2. Compared to the inspecting device 100, the density of the pitch D22 of the screw 232 of the detecting device in the embodiment is less than the density of the pitch D12. The pitch D22 is closer to the carrier 110 than the pitch D12. In other words, the pitch D12 has a denser thread, while the pitch D22 has a sparser thread, and the pitch D22 connects the pitch D12 and the end 2322, but the disclosure is not limited thereto.

Based on the above, a conductive structure is designed in the inspecting device in the disclosure, the conductive structure is partially embedded in the locking component, and the conductive structure, the locking component, and the ground pad are electrically connected, so that the current of the semiconductor package flows back to the ground pad through the conductive structure and the locking component during subsequent inspections. Therefore, the backflow path of currents is improved while the warpage is reduced, and the ratio of current backflow is increased, and thereby having a better power integrity/signal integrity performance. In addition, the locking component may include screws with different pitch densities, so that during electrical inspection the probability of the shaking of the inspecting device which affects the inspection result is reduced.

Although the disclosure has been described with reference to the above embodiments, it will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. An inspecting device, comprising:
    a carrier with a through hole and a ground pad corresponding to the through hole, wherein the carrier comprises a first surface and a second surface opposite to the first surface, the through hole penetrates from the first surface to the second surface, and the ground pad is disposed on the second surface;
    a plurality of telescopic probes disposed in parallel on the first surface of the carrier;
    a locking component passing through the through hole, wherein the locking component comprises a screw, a head of the screw comprises a first pitch and a second pitch, and a density of the first pitch is different from a density of the second pitch; and
    a conductive structure partially embedded in the locking component, wherein the conductive structure, the locking component, and the ground pad are electrically connected.

2. The inspecting device according to claim 1, wherein the density of the first pitch is less than the density of the second pitch, and the first pitch is farther away from the carrier than the second pitch.

3. The inspecting device according to claim 1, wherein the density of the first pitch is less than the density of the second pitch, and the first pitch is closer to the carrier than the second pitch.

4. The inspecting device according to claim 1, wherein the conductive structure comprises conductive glue.

5. The inspecting device according to claim 1, wherein a top surface of the conductive structure is coplanar with top surfaces of the plurality of the telescopic probes.

6. The inspecting device according to claim 1, wherein the conductive structure comprises a protruding part on the locking component.

7. The inspecting device according to claim 6, wherein a distance is between an edge of the protruding part and an edge of the locking component.

8. The inspecting device according to claim 1, wherein the locking component further comprises a gasket and a threaded sleeve stacked on the head, and part of the conductive structure is located between the gasket and the head.

9. The inspecting device according to claim 8, wherein the gasket and the threaded sleeve respectively comprise a first hollow part and a second hollow part, and the conductive structure is extruded and separated from the first hollow part and the second hollow part.

10. The inspecting device according to claim 8, wherein the gasket is located between the threaded sleeve and the part of the conductive structure.

11. The inspecting device according to claim 8, wherein the top of the threaded sleeve comprises a removal hole.

12. The inspecting device according to claim 1, wherein the top surface of the conductive structure is arched.

13. The inspecting device according to claim 1, wherein the locking component further comprises a nut penetrating an end of the screw opposite to the head and disposed on the second surface.

14. The inspecting device according to claim 1, further comprising a supporting plate disposed on the second surface, wherein the screw passes through and is disposed on the supporting plate, and the supporting plate comprises a conductive material.

15. The inspecting device according to claim 1, wherein the orthographic projection of the conductive structure on the carrier overlaps the ground pad.

16. The inspecting device according to claim 1, wherein the orthographic projection of the locking component on the carrier overlaps the ground pad.

17. The inspecting device according to claim 1, wherein the conductive structure is in direct contact with the screw.

18. An inspecting device adapted for inspecting semiconductor packages, wherein the inspecting device comprises:

a carrier with a through hole and a ground pad corresponding to the through hole, wherein the carrier comprises a first surface and a second surface opposite to the first surface, the through hole penetrates from the first surface to the second surface, and the ground pad is disposed on the second surface;

a plurality of telescopic probes disposed in parallel on the first surface of the carrier;

a locking component passing through the through hole, wherein the locking component comprises a screw, a head of the screw comprises a first pitch and a second pitch, and a density of the first pitch is different from a density of the second pitch; and a conductive structure disposed on the locking component, wherein the inspecting device is adapted for currents of the semiconductor packages to flow back to the ground pad through the conductive structure and the locking component.

19. The inspecting device according to claim 18, wherein the locking component further comprises a nut passing through an end of the screw and connected to the head, and the inspecting device is adapted for currents of the semiconductor packages to flow back the ground pad through the conductive structure, the screw, and the nut.

20. The inspecting device according to claim 19, further comprising a supporting plate disposed on the second surface, the inspecting device is adapted for currents of the semiconductor packages to flow back to the ground pad through the conductive structure, the screw, the nut, and the supporting plate.

* * * * *